United States Patent
Wu et al.

(10) Patent No.: US 8,552,441 B2
(45) Date of Patent: Oct. 8, 2013

(54) ALGAINP LIGHT-EMITTING DIODE HAVING VERTICAL STRUCTURE WITH TRANSPARENT MULTILAYERED REFLECTIVE FILMS

(75) Inventors: Hou-Jun Wu, Xiamen (CN); Yu-Tsai Teng, Xiamen (CN); Po-Hung Tsou, Xiamen (CN); Hsiang-Ping Cheng, Xiamen (CN); Jyh-Chiarng Wu, Xiamen (CN)

(73) Assignee: Xiamen Sanan Optoelectronics Technology Co., Ltd., Xiamen, Fujian (CN)

( * ) Notice: Subject to any disclaimer, the term of this patent is extended or adjusted under 35 U.S.C. 154(b) by 0 days.

(21) Appl. No.: 13/213,331

(22) Filed: Aug. 19, 2011

(65) Prior Publication Data

US 2012/0043566 A1    Feb. 23, 2012

(30) Foreign Application Priority Data

Aug. 20, 2010   (CN) .......................... 2010 1 0258130

(51) Int. Cl.
  *H01L 33/00*   (2010.01)
(52) U.S. Cl.
  USPC ................................... 257/94; 257/E33.064
(58) Field of Classification Search
  USPC ................... 257/9, 12, 13, 14, 21, 79, 81, 82, 257/85–90, 94, 96–99, E51.021, E33.068, 257/E33.069, E33.072, E33.064; 438/29, 438/69, 72
  See application file for complete search history.

(56) References Cited

U.S. PATENT DOCUMENTS 7,622,746 B1 * 11/2009 Lester et al. ..................... 257/98
2011/0163293 A1 * 7/2011 Chung et al. ..................... 257/13

* cited by examiner

*Primary Examiner* — Selim Ahmed
(74) *Attorney, Agent, or Firm* — Boyle Fredrickson, S.C.

(57) ABSTRACT

A method for manufacturing the AlGaInP LED having a vertical structure is provided, including: growing, epitaxially, a buffer layer, an n-type contact layer, an n-type textured layer, a confined layer, an active layer, a p-type confined layer and a p-type window layer in that order on a temporary substrate, to form a texturable epitaxial layer; forming a transparent conducting film with periodicity on the p-type window layer of the epitaxial layer, forming a regulated through-hole on the transparent conducting film, and filling the through-hole with a conducting material; forming a total-reflection metal layer on the transparent conducting film; bonding a permanent substrate with the texturable epitaxial layer via a bonding layer, and bring the total-reflection metal layer into contact with the bonding layer; removing the temporary substrate and the buffer layer; forming an n-type extension electrode on the exposed n-type contact layer; removing the n-type contact layer, and forming a pad on the n-type textured layer; and forming a p-type electrode on a back of the permanent substrate. The transparent multilayered film with periodicity provides a greater reflectivity difference and hence brings better results than the conventional reflector consisting of single-layered, or, non-periodic, transparent films; and light-emitting efficiency is enhanced.

8 Claims, 3 Drawing Sheets

ALGAINP LIGHT-EMITTING DIODE HAVING VERTICAL STRUCTURE WITH TRANSPARENT MULTILAYERED REFLECTIVE FILMS

CROSS REFERENCE TO RELATED APPLICATION

This application claims the benefit of Chinese patent application 201010258130.7 filed Aug. 20, 2010 hereby incorporated by reference.

FIELD OF INVENTION

The present invention relates to an AlGaInP light-emitting diode having a vertical structure, and more particularly to an AlGaInP light-emitting diode having a vertical structure and a transparent film with periodicity and a method for manufacturing the same.

BACKGROUND OF THE INVENTION

Nowadays, high-brightness AlGaInP light-emitting diodes (LEDs) have been widely used, and the application of AlGaInP LEDs based on flip-chip technologies is even wider. FIG. 1 shows a sectional view of an existing flip-chip based AlGaInP LED chip. The structure includes a silicon substrate 200, and the silicon substrate 200 has an upper main surface and a lower main surface. On the upper surface, a metal bonding layer 203, a reflector 201, a p-GaP window layer 107, a p-AlGaInP confined layer 106, a multiple-quantum-well (MQW) active layer 105 and a textured n-AlGaInP confined layer 104 are stacked in that order; an n-GaAs contact layer 103 is arranged on part of the textured n-AlGaInP confined layer 104; an n-type extension electrode 205 is arranged on the n-GaAs contact layer 103; and an n-type pad 206 is arranged on another part of the textured n-AlGaInP confined layer 104 and in electrical contact with the n-type extension electrode 205. A p-type electrode 204 is formed on the lower surface of the silicon substrate 200. In the flip-chip structure above, the angle at which light is reflected from the reflector combination is relatively limited, resulting in poor luminous efficiency.

SUMMARY OF THE INVENTION

To solve the problem above, the present invention provides an AlGaInP LED having a vertical structure and a method for manufacturing the same.

The technical solution provided by the present invention includes an AlGaInP light-emitting diode (LED) having a vertical structure, including:
a epitaxial layer, including a buffer layer, an n-type textured confined layer, an n-type contact layer, an active layer, a p-type confined layer and a p-type window layer that are stacked;
a transparent conducting film having at least two periods, formed on the p-type window layer, wherein the transparent conducting film includes stacked transparent conducting layers and transparent dielectric layers;
a series of through-holes, distributed in the transparent conducting film;
a total-reflection metal layer, formed on the transparent conducting film, wherein the total-reflection metal layer fills up the through-holes;
a permanent substrate, bonded with the epitaxial layer via a metal bonding layer, wherein the total-reflection metal layer is in contact with the bonding layer;
an n-type extension electrode, in ohmic contact with the n-type contact layer; and
an n-type pad, formed on the n-type textured confined layer.

A method for manufacturing the AlGaInP LED having a vertical structure includes the following steps:
providing a temporary substrate,
growing a buffer layer, an n-type contact layer, an n-type textured confined layer, an active layer, a p-type confined layer and a p-type window layer in that order on the temporary substrate, to form a texturable epitaxial layer, wherein the material of the texturable epitaxial layer is AlGaInP or AlInP;
manufacturing a transparent conducting film with periodicity on the p-type window layer of the epitaxial layer,
forming a series of through-holes on the transparent conducting film;
forming a total-reflection metal layer on the transparent conducting film, wherein the total-reflection metal layer fills up the through-holes;
providing a permanent substrate, bonding the permanent substrate with the texturable epitaxial layer via a bonding layer, and bring the total-reflection metal layer into contact with the bonding layer;
removing the temporary substrate and the buffer layer such that the n-type contact layer is exposed;
manufacturing an n-type extension electrode on the exposed n-type contact layer;
removing the exposed of the n-type contact layer, and forming a pad on the n-type textured layer; and
manufacturing a p-type electrode on a back of the permanent substrate.

In the AlGaInP LED having a vertical structure according to the present invention, the material of the permanent substrate may be one or more selected from a group consisting of Ge, Si, GaP, GaAs, InP, Cu and Mo; the material of the transparent conducting layer may be a metal oxide such as ITO, ZnO, AZO, ATO and FTO; the material of the transparent dielectric layer may be an insulating dielectric that is easily etchable, such as $SiO_2$ and $Si_3N_4$; a regulated through-hole may be formed in the transparent conducting film with periodicity; the material of the total-reflection metal layer may be one or more selected from a group consisting of Ag, Al, Pt, Pd, Au, AuBe and AuZn; the p-type window layer may have a carrier concentration larger than $1\times10^{18}$ $cm^{-3}$; the n-type contact layer may have a carrier concentration larger than $1\times10^{18}$ $cm^{-3}$; and the material of the n-type extension electrode may be one or more selected from a group consisting of Ge, Au and Ni.

In the method for manufacturing the AlGaInP LED having a vertical structure according to the present invention, the material of the temporary substrate may be GaAs, GaP, Ge or Si; the material of the the p-type window layer may be GaP, GaAsP or AlGaAs; the p-type window layer may have a doping concentration less than $1\times10^{19}$ $cm^{-3}$ and larger than $1\times10^{18}$ $cm^{-3}$; the material of the n-type contact layer may be GaAs or AlGaAs; the n-type contact layer may have a doping concentration larger than $1\times10^{18}$ $cm^{-3}$; the material of the transparent conducting layer may be ITO, ZnO, AZO or FTO; the material of the transparent dielectric layer may be $SiO_2$ or $Si_3N_4$; the material of the conducting material filled in the through-hole may be Ag, Al, Pt, Pd, Au, AuBe or AuZn; the regulated through-hole may be formed such that it is away from under the n-type pad and the n-type extension electrode and has a shape according to practical needs; the material of the total-reflection metal layer may be one or more selected from a group consisting of Ag, Al, Pt, Pd, Au, AuBe and AuZn; the material of the permanent substrate may be one or more selected from a group consisting of Ge, Si, GaP, GaAs, InP, Cu and Mo; the material of the bonding layer may be one or more selected from a group consisting of Au, Ag, Sn, In, Pt, Ni and Ti, alternatively, the material of the bonding layer may be one or more selected from a group consisting of AuSn, InAu, AuSi, AuGe, AuBe, AgSn and AgSnCu; and the material of the n-type extension electrode may be one or more selected from a group consisting of Ge, Au and Ni.

The advantageous effects of the technical solution provided by the present invention are that, e.g., the transparent multilayered film with periodicity provides a greater reflectivity difference and hence brings better results than the conventional reflector consisting of single-layered, or, non-periodic, transparent films; the specular reflectivity in the manufacturing process of flip-chip based AlGaInP LEDs is improved, light-emitting efficiency is enhanced; and the manufacturing process according to the present invention is relatively easy.

Figure 1:
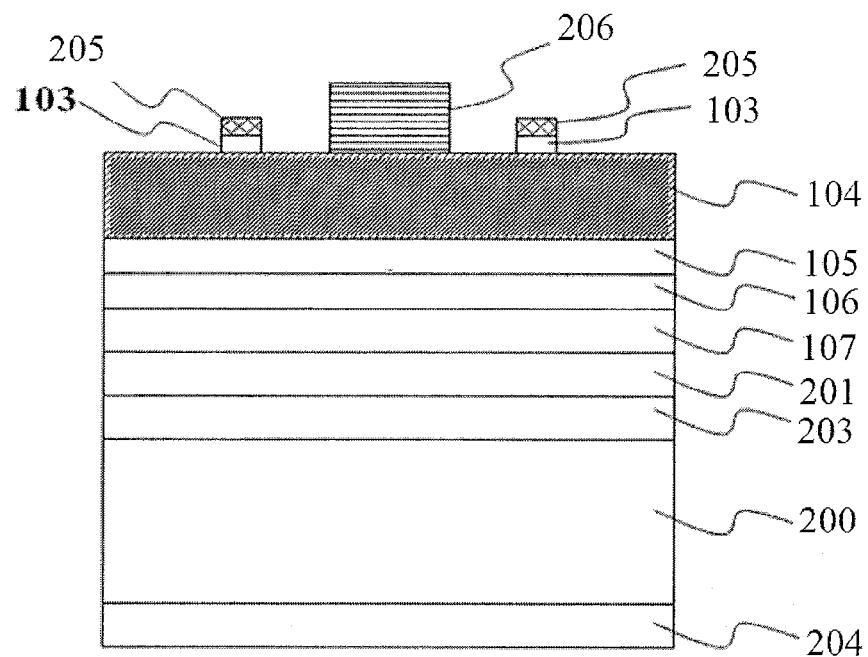
FIG. 1 is a sectional view of an existing flip-chip based AlGaInP LED.

Reference numerals in the accompanying drawings are listed below:
100: GaAs substrate;
101: buffer layer;
103: n-GaAs contact layer;
104: n-AlGaInP textured confined layer;
105: multiple-quantum well (MQW) active layer;
106: p-AlGaInP confined layer;
107: p-GaP window layer;
200: Si substrate;
201: reflector
201A: first period ITO layer;
201B: second period ITO layer;
201C: first period $SiO_2$ layer;
201D: second period $SiO_2$ layer;
201E: though-holes;
202: total-reflection metal layer
203: metal bonding layer;
204: p-type electrode;
205: n-type extension electrode; and
206: n-type pad.

DESCRIPTION OF THE PREFERRED EMBODIMENTS

The present invention is described in details hereinafter in conjunction with the accompanying drawings and the embodiments.

The method for manufacturing a flip-chip AlGaInP diode with a vertical structure and a Distributed Bragg Reflector (DBR) having two periods are described hereinafter with reference to FIG. 2 and FIGS. 3 to 5.

Figure 2:
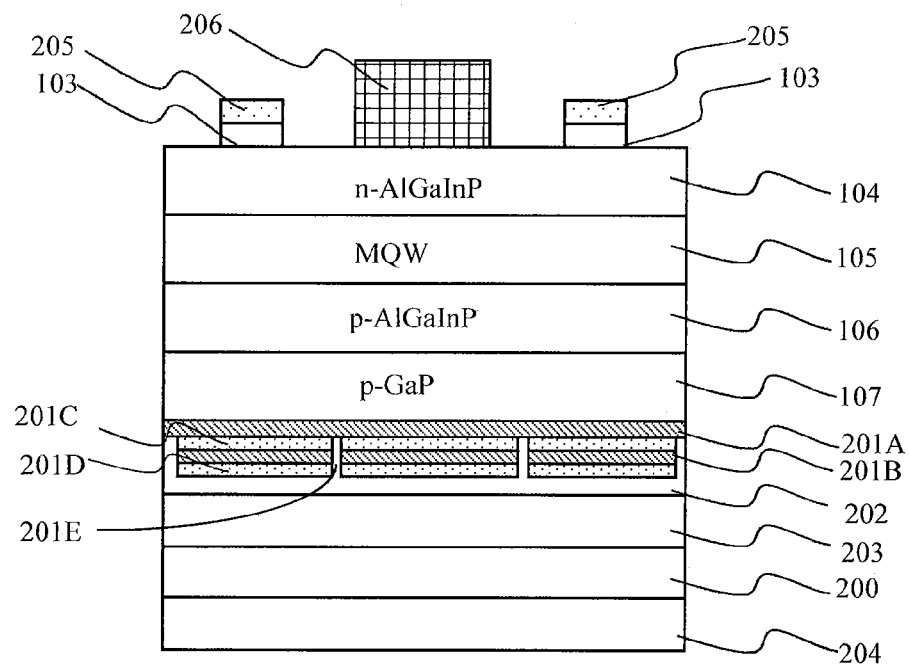
FIG. 2 is a sectional view of a flip-chip based AlGaInP LED having a vertical structure and a transparent conducting film with periodicity, according to a preferred embodiment of the present invention.

As shown in FIG. 2, the structure of a flip-chip based Aluminium gallium indium phosphide (AlGaInP) LED according to the present invention includes: a Si substrate 200; a TiAu metal bonding layer 203; a reflector 201, which is a transparent conducting film having two periods, the transparent conducting film including stacked first period ITO layer 201A, first period $SiO_2$ layer 201C, second period ITO layer 201B, and second period $SiO_2$ layer 201D; a series of through-holes 201E, distributed in the transparent conducting film 201; a total-reflection metal layer 202, formed on the transparent conducting film and filling up the through-holes; a p-GaP window layer 107; a p-AlGaInP confined layer 106; a Multiple-Quantum Well (MQW) active layer 105; an n-AlGaInP textured confined layer 104; an n-GaAs contact layer 103; a p-type electrode 204; an n-type extension electrode 205; and an n-type pad 206.

Figure 3A:
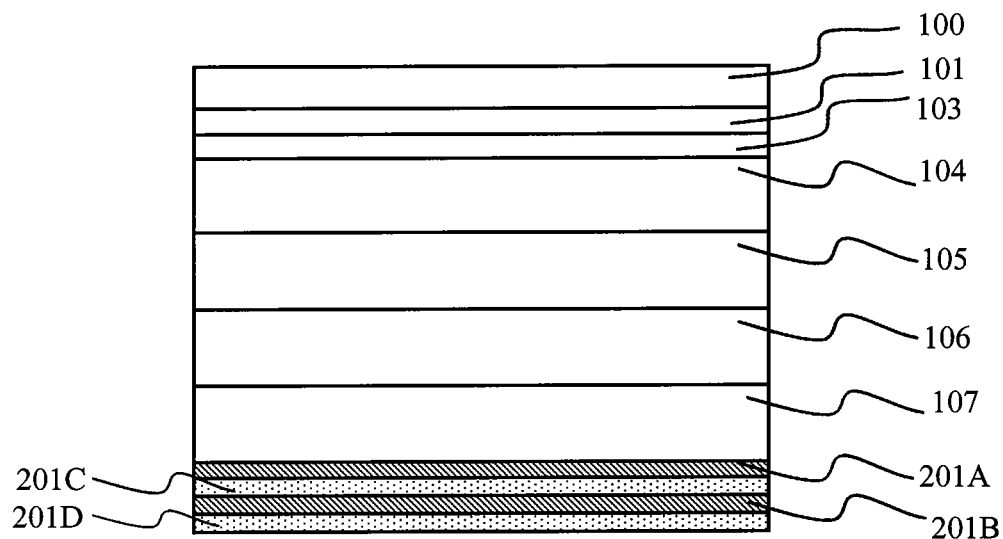
FIGS. 3a, 3b and 3c show the steps for manufacturing a flip-chip based AlGaInP LED with a transparent multilayered film having two periods according to the present invention.

A method for manufacturing the AlGaInP LED above includes the following steps:

As shown in FIG. 3a, by Metal Organic Chemical Vapor Deposition (MOCVD), a buffer layer 101, an n-GaAs contact layer 103, an n-AlGaInP textured confined layer 104, an MQW active layer 105, a p-AlGaInP confined layer 106, and a p-GaP window layer 107 are grown on a GaAs substrate 100 in that order. The concentration of the p-GaP window layer 107 is larger than $1 \times 10^{18}$ cm$^{-3}$ and less than $1 \times 10^{19}$ cm$^{-3}$. The transparent conducting film having two periods and including ITO layer 201A, $SiO_2$ layer 201C, ITO layer 201B and $SiO_2$ layer 201D is formed by electron beam deposition or sputtering.

Figure 3B:
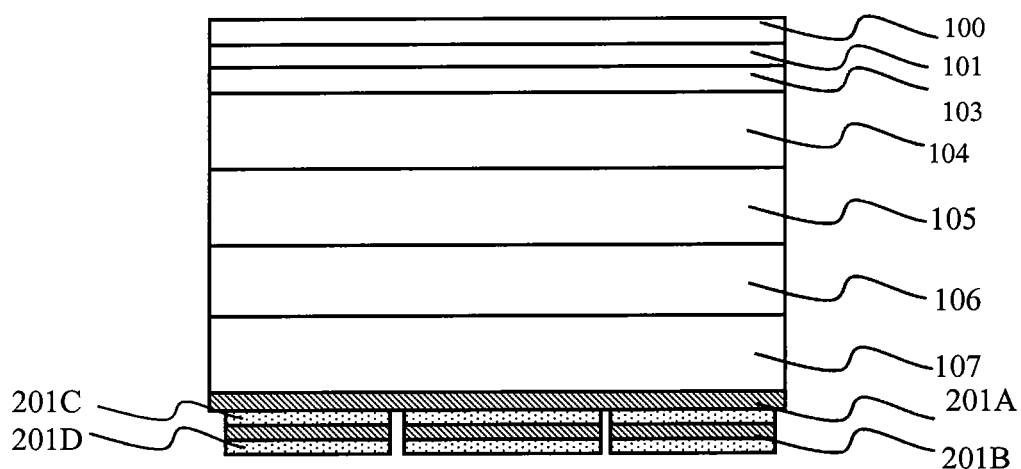

As shown in FIG. 3b, by covering the second period $SiO_2$ transparent dielectric layer 201D with a photolithography mask and using a regular etchant, the second period $SiO_2$ transparent dielectric layer 201D, the second period ITO transparent conducting layer 201B and the first period $SiO_2$ transparent dielectric layer 201C are etched to form through-holes.

Figure 3C:
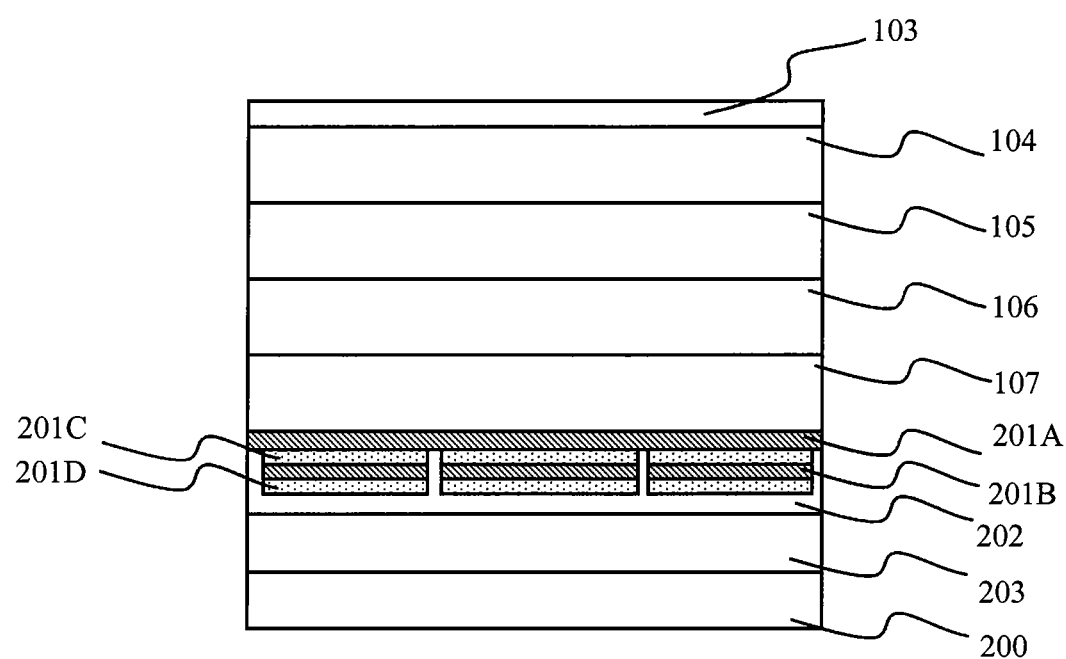

As shown in FIG. 3c, AuBe or AuZn is deposited on the transparent conducting film by sputtering or electron beam deposition, and fills the through-holes 201E, to form a total-reflection metal layer 202. Then, a Si substrate 200 is provided as a permanent substrate, and a double-layered Ti/Au structure is deposited on it, with the thickness of Ti being 500 Å, and the thickness of Au being 4000 Å. A metal bonding layer 203 is formed in the condition of temperature 330° C. and pressure 5000 kg, to bond the permanent substrate 200 with the epitaxial layer. The GaAs substrate 100 and the buffer layer 101 are removed completely by a mixture of ammonia and oxydol.

As shown in FIG. 2, an n-type extension electrode 205 is formed on the n-GaAs contact layer 103, according to a conventional LED manufacturing method. The portion of the n-GaAs contact layer 103 under the n-type extension electrode 205 is etched out so as to expose the AlGaInP textured layer 104. A double layered Cr/Au n-type pad 206 is formed on the AlGaInP textured layer 104, with the thickness of Cr being 500 Å, and the thickness of Au being 3 μm. Finally, a p-type electrode 204 is formed on the bottom of the Si substrate 200. The material of the p-type electrode 204 is Ti/Au, with the thickness of Ti being 500 Å, and the thickness of Au being 4000 Å. Thus the AlGaInP LED having a vertical structure according to the present invention is manufactured.

The embodiments above are for illustrative purpose only, and should not be interpreted as limiting the scope of the present invention. Various alternations and modifications can be made by those skilled in the art without departing from the scope of the present invention. Therefore, the equivalents should fall within the scope of the present invention, which is defined by the claims.

The invention claimed is:

1. An AlGaInP light-emitting diode (LED) having a vertical structure, comprising:
    an epitaxial layer, comprising an n-type textured confined layer, an n-type contact layer, an active layer, a p-type confined layer and a p-type window layer that are stacked;
       a stacked transparent layers having at least two periods, formed below the p-type window layer, wherein the stacked transparent layers comprises stacked transparent conducting layers and transparent dielectric layers;
       a series of through-holes, distributed in the stacked transparent layers;
       a total-reflection metal layer, formed below the stacked transparent layers, wherein the total-reflection metal layer fills up the through-holes;
       a permanent substrate, bonded with the epitaxial layer via a metal bonding layer, wherein the total-reflection metal layer is in contact with the bonding layer;
       an n-type extension electrode, in ohmic contact with the n-type contact layer; and
       an n-type pad, formed on the n-type textured confined layer.

2. The AlGaInP LED having a vertical structure according to claim 1, wherein the material of the permanent substrate is one or more selected from a group consisting of Ge, Si, GaP, GaAs, InP, Cu and Mo.

3. The AlGaInP LED having a vertical structure according to claim 1, wherein the material of the transparent conducting layer is ITO, ZnO, AZO, ATO or FTO; and the material of the transparent dielectric layer is $SiO_2$ or $Si_3N_4$.

4. The AlGaInP LED having a vertical structure according to claim 1, wherein a regulated through-hole is formed in the stacked transparent layers with periodicity.

5. The AlGaInP LED having a vertical structure according to claim 1, wherein the material of the total-reflection metal layer is one or more selected from a group consisting of Ag, Al, Pt, Pd, Au, AuBe and AuZn.

6. The AlGaInP LED having a vertical structure according to claim 1, wherein the p-type window layer has a carrier concentration larger than $1 \times 10^{18}$ $cm^{-3}$.

7. The AlGaInP LED having a vertical structure according to claim 1, wherein the n-type contact layer has a carrier concentration larger than $1 \times 10^{18}$ $cm^{-3}$.

8. The AlGaInP LED having a vertical structure according to claim 1, wherein the material of the n-type extension electrode is one or more selected from a group consisting of Ge, Au and Ni.

* * * * *